US008037438B2

(12) United States Patent
    Li et al.

(10) Patent No.: US 8,037,438 B2
(45) Date of Patent: Oct. 11, 2011

(54) TECHNIQUES FOR PARALLEL BUFFER INSERTION

(75) Inventors: Zhuo Li, Cedar Park, TX (US); Charles J. Alpert, Cedar Park, TX (US); Damir Jamsek, Austin, TX (US); Chin Ngai Sze, Austin, TX (US); Ying Zhou, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 12/395,373

(22) Filed: Feb. 27, 2009

(65) Prior Publication Data

US 2010/0223586 A1    Sep. 2, 2010

(51) Int. Cl.
    *G06F 17/50* (2006.01)
(52) U.S. Cl. ........ 716/114; 716/126; 716/134; 716/136; 703/16
(58) Field of Classification Search ................ 716/6, 13, 716/14, 113, 114, 126, 134, 136; 703/16
    See application file for complete search history.

(56) References Cited

U.S. PATENT DOCUMENTS

| | | | | |
|---|---|---|---|---|
| 6,347,393 | B1 * | 2/2002 | Alpert et al. | 716/114 |
| 6,412,101 | B1 * | 6/2002 | Chang et al. | 716/104 |
| 6,698,006 | B1 * | 2/2004 | Srinivasan et al. | 716/114 |
| 6,701,506 | B1 * | 3/2004 | Srinivasan et al. | 716/114 |
| 6,701,507 | B1 * | 3/2004 | Srinivasan | 716/114 |
| 6,754,877 | B1 * | 6/2004 | Srinivasan | 716/114 |
| 6,910,195 | B2 * | 6/2005 | Akkiraju | 716/114 |
| 6,915,496 | B2 * | 7/2005 | Alpert et al. | 716/114 |
| 6,925,624 | B2 * | 8/2005 | Komoda | 716/115 |
| 6,928,401 | B1 * | 8/2005 | Wanek | 703/14 |
| 7,003,741 | B2 * | 2/2006 | Srinivasan | 716/113 |
| 7,013,442 | B2 * | 3/2006 | Suaya et al. | 716/113 |
| 7,062,743 | B2 * | 6/2006 | Kahng et al. | 716/122 |
| 7,065,730 | B2 * | 6/2006 | Alpert et al. | 716/114 |
| 7,426,706 | B2 * | 9/2008 | Suaya et al. | 716/100 |
| 7,454,730 | B1 * | 11/2008 | Chowdhury | 716/114 |
| 7,653,884 | B2 * | 1/2010 | Furnish et al. | 716/103 |
| 7,669,160 | B2 * | 2/2010 | Furnish et al. | 716/119 |
| 7,752,588 | B2 * | 7/2010 | Bose | 716/122 |
| 2003/0131334 | A1 * | 7/2003 | Suaya et al. | 716/12 |

(Continued)

OTHER PUBLICATIONS

Adler et al., "Uniform Repeater Insertion in RC Trees", IEEE Transactions on Circuits and Systems—I: Fundamental Theory and Applications, vol. 47, No. 10, Oct. 2000, pp. 1515-1523.*

(Continued)

*Primary Examiner* — Phallaka Kik
(74) *Attorney, Agent, or Firm* — Suiter Swantz pc llo

(57) ABSTRACT

The present disclosure is directed to a method for determining a plurality of buffer insertion locations in a net for an integrated circuit design. The method may comprise calculating a plurality of resistive-capacitive (RC) influences in parallel, each RC influence corresponding to one of a plurality of buffering options available for a first sub-tree for the addition of a wire segment to the first sub-tree; updating the plurality of RC influences for the addition of a buffer for the first sub-tree, the buffer comprising one of a plurality of buffer types; and merging the first sub-tree with a second sub-tree in parallel by grouping the plurality of buffering options available for the first sub-tree and a plurality of buffering options available for the second sub-tree into a plurality of merging groups, and merging at least two groups of the plurality of merging groups in parallel.

15 Claims, 10 Drawing Sheets

U.S. PATENT DOCUMENTS

| | | | |
|---|---|---|---|
| 2004/0064793 A1* | 4/2004 | Alpert et al. | 716/2 |
| 2004/0117753 A1* | 6/2004 | Kahng et al. | 716/12 |
| 2004/0153984 A1* | 8/2004 | Akkiraju | 716/6 |
| 2004/0210857 A1* | 10/2004 | Srinivasan | 716/2 |
| 2004/0216072 A1* | 10/2004 | Alpert et al. | 716/13 |
| 2006/0143586 A1* | 6/2006 | Suaya et al. | 716/13 |
| 2007/0150846 A1* | 6/2007 | Furnish et al. | 716/8 |
| 2007/0204252 A1* | 8/2007 | Furnish et al. | 716/10 |
| 2008/0141206 A1* | 6/2008 | He | 716/12 |
| 2008/0216025 A1* | 9/2008 | Furnish et al. | 716/2 |
| 2008/0216038 A1* | 9/2008 | Bose | 716/8 |
| 2008/0216039 A1* | 9/2008 | Furnish et al. | 716/9 |
| 2008/0216040 A1* | 9/2008 | Furnish et al. | 716/10 |
| 2009/0013300 A1* | 1/2009 | Suaya et al. | 716/13 |
| 2009/0193375 A1* | 7/2009 | Izuha | 716/6 |
| 2009/0254874 A1* | 10/2009 | Bose | 716/6 |

OTHER PUBLICATIONS

Adler et al., "Repeater Design to Reduce Delay and Power in Resistive Interconnect", IEEE Transactions on Circuits and Systems—II: Analog and Digital Signal Processing, vol. 45, No. 5, May 1998, pp. 607-616.*

Akkiraju et al., "Spec Based Flip-Flop and Buffer Insertion", Proceedings of 21$^{st}$ International Conference on Computer Design, Oct. 13-15, 2003, 6 pages.*

Alpert et al., "Accurate Estimation of Global Buffer Delay Within a Floorplan", IEEE Transactions on Computer-Aided Design of Integrated Circuits and Systems, vol. 25, No. 6, Jun. 2006, pp. 1140-1146.*

Ismail et al., "Repeater Insertion in Tree Structured Inductive Interconnect", IEEE Transactions on Circuits and Systems—II: Analog and Digital Signal Processing, vol. 48, No. 5, May 2001, pp. 471-481.*

Nose et al., "Two Schemes to Reduce Interconnect Delay in Bi-Directional and Uni-Directional Buses", 2001 Symposium on VLSI Circuits, Jun. 14-16, 2001, pp. 193-194.*

Shah et al., "Wiresizing with Buffer Placement and Sizing for Power-Delay Tradeoffs", Proceedings of Ninth International Conference on VLSI Design, Jan. 3-6, 1996, pp. 346-351.*

* cited by examiner

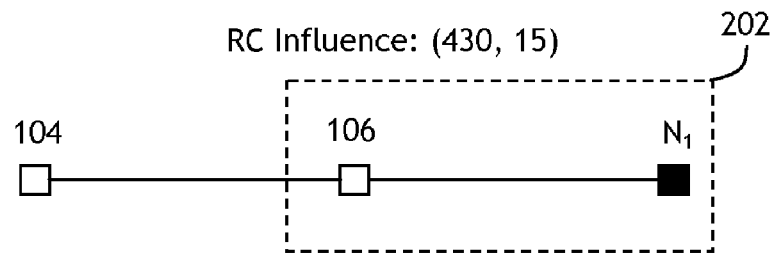
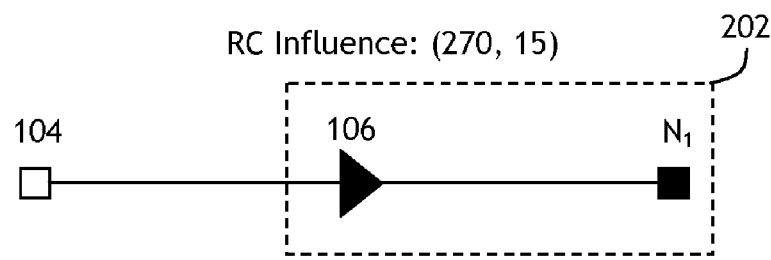
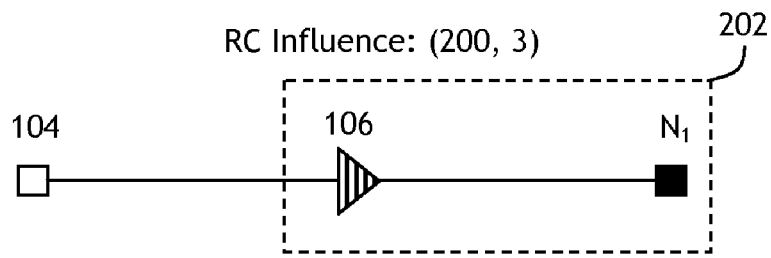
FIG. 2

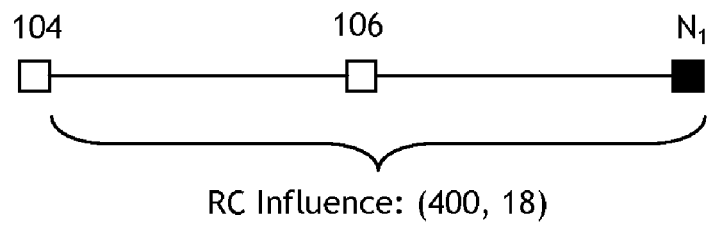
(a)
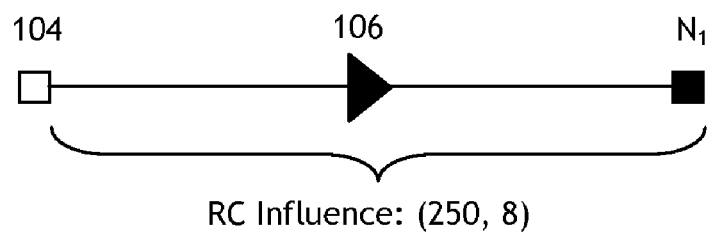
(b)
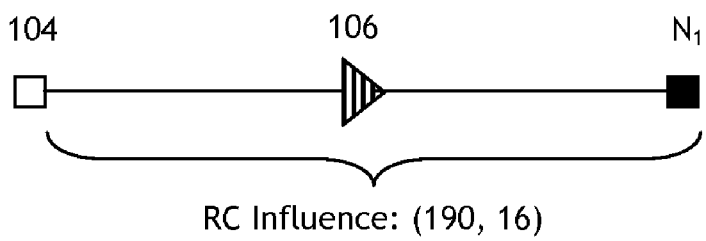
(c)
FIG. 3

900

| 902 Calculating a plurality of resistive-capacitive (RC) influences in parallel |
|---|
| 904 Calculating a first RC influence for adding a wire segment to the first sub-tree in a first buffering option |
| 906 Calculating a second RC influence in parallel with the first RC influence for adding the wire segment to the first sub-tree in a second buffering option |

| 908 Updating the plurality of RC influences for the addition of a buffer for the first sub-tree |
|---|
| 910 Calculating in parallel a first set of buffer RC influences for the first sub-tree as configured in the first buffering option |
| 912 Storing the first set of buffer RC influences to a buffer RC influence holder |
| 914 Calculating in parallel a second set of buffer RC influences for the first sub-tree as configured in the second buffering option |
| 916 Updating the buffer RC influence holder |

| 918 Merging the first sub-tree with a second sub-tree in parallel by grouping a plurality of merging groups, and merging at least two groups of the plurality of merging groups in parallel |
|---|

FIG. 9

TECHNIQUES FOR PARALLEL BUFFER INSERTION

TECHNICAL FIELD

The present disclosure generally relates to the field of integrated circuit design, and more particularly to a method for determining a plurality of buffer insertion locations in a net for an integrated circuit design.

BACKGROUND

An Integrated Circuit (IC) chip may be fabricated by first conceiving a logical circuit description, and then converting the logical circuit description into a physical description (geometric layout). This process may be carried out utilizing a record of interconnections (may also be known as nets) between logical cells of the IC chip. A layout may be checked to ensure that all design requirements, for example timing requirements, are satisfied.

When designing certain IC chips, such as Very Large Scale Integration (VLSI) circuits, buffers (e.g., amplifiers or inverters) may be utilized for achieving timing objectives and fixing electrical violations for interconnections. Increasing complexity of chip designs also increases the complexity and importance of buffer insertions.

SUMMARY

The present disclosure is directed to a method for determining a plurality of buffer insertion locations in a net for an integrated circuit design. The method may comprise calculating a plurality of resistive-capacitive (RC) influences in parallel, each RC influence corresponding to one of a plurality of buffering options available for a first sub-tree for the addition of a wire segment to the first sub-tree; updating the plurality of RC influences for the addition of a buffer for the first sub-tree, the buffer comprising one of a plurality of buffer types; and merging the first sub-tree with a second sub-tree in parallel by grouping the plurality of buffering options available for the first sub-tree and a plurality of buffering options available for the second sub-tree into a plurality of merging groups, and merging at least two groups of the plurality of merging groups in parallel.

A further embodiment of the present disclosure is directed to a computer-readable medium having computer-executable instructions for performing a method for determining a plurality of buffer insertion locations in a net for an integrated circuit design. The method for determining a plurality of buffer insertion locations may comprise calculating a plurality of resistive-capacitive (RC) influences in parallel, each RC influence corresponding to one of a plurality of buffering options available for a first sub-tree for the addition of a wire segment to the first sub-tree; updating the plurality of RC influences for the addition of a buffer for the first sub-tree, the buffer comprising one of a plurality of buffer types; and merging the first sub-tree with a second sub-tree in parallel by grouping the plurality of buffering options available for the first sub-tree and a plurality of buffering options available for the second sub-tree into a plurality of merging groups, and merging at least two groups of the plurality of merging groups in parallel.

A further embodiment of the present disclosure is directed to a computer system. The computer system may comprise at least one processor for processing a plurality of program instructions; a memory device accessible to the at least one processor; the plurality of program instructions for determining a plurality of buffer insertion locations in a net for an integrated circuit design, comprising: calculating a plurality of resistive-capacitive (RC) influences in parallel, each RC influence corresponding to one of a plurality of buffering options available for a first sub-tree for the addition of a wire segment to the first sub-tree; updating the plurality of RC influences for the addition of a buffer for the first sub-tree, the buffer comprising one of a plurality of buffer types; and merging the first sub-tree with a second sub-tree in parallel by grouping the plurality of buffering options available for the first sub-tree and a plurality of buffering options available for the second sub-tree into a plurality of merging groups, and merging at least two groups of the plurality of merging groups in parallel.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which:

FIG. 2 is an illustration of a plurality of buffering options for a sub-tree of the exemplary tree of FIG. 1;

FIG. 3 is an illustration of resistive-capacitive (RC) influences for the plurality of buffering options of FIG. 2;

FIG. 9 is a flow diagram illustrating a method for determining a plurality of buffer insertion locations in a net for an integrated circuit design.

DETAILED DESCRIPTION

Reference will now be made in detail to the subject matter disclosed, which is illustrated in the accompanying drawings.

Buffers (e.g., amplifiers or inverters) may be utilized in Integrated Circuit (IC) chip designs for achieving timing objectives and fixing electrical violations for interconnections. Methods such as van Ginneken algorithm may be utilized for choosing buffer insertion positions for a wiring tree such that the Elmore-delay is minimal. The van Ginneken algorithm may utilize a dynamic programming approach to process a net for an IC design sequentially in a bottom-up manner. Increasing complexity of chip designs increases the complexity of buffer insertions. Therefore, a parallel buffer insertion algorithm may be appreciated.

The present disclosure is directed to a method for determining a plurality of buffer insertion locations in a net for an integrated circuit design. Parallelization is provided for the three components (i.e., adding wire, adding buffer, and merging) of the dynamic programming buffer insertion process of the van Ginneken algorithm. The parallel buffer insertion method may reduce the number of sequential operations and improve processing time.

Figure 1:
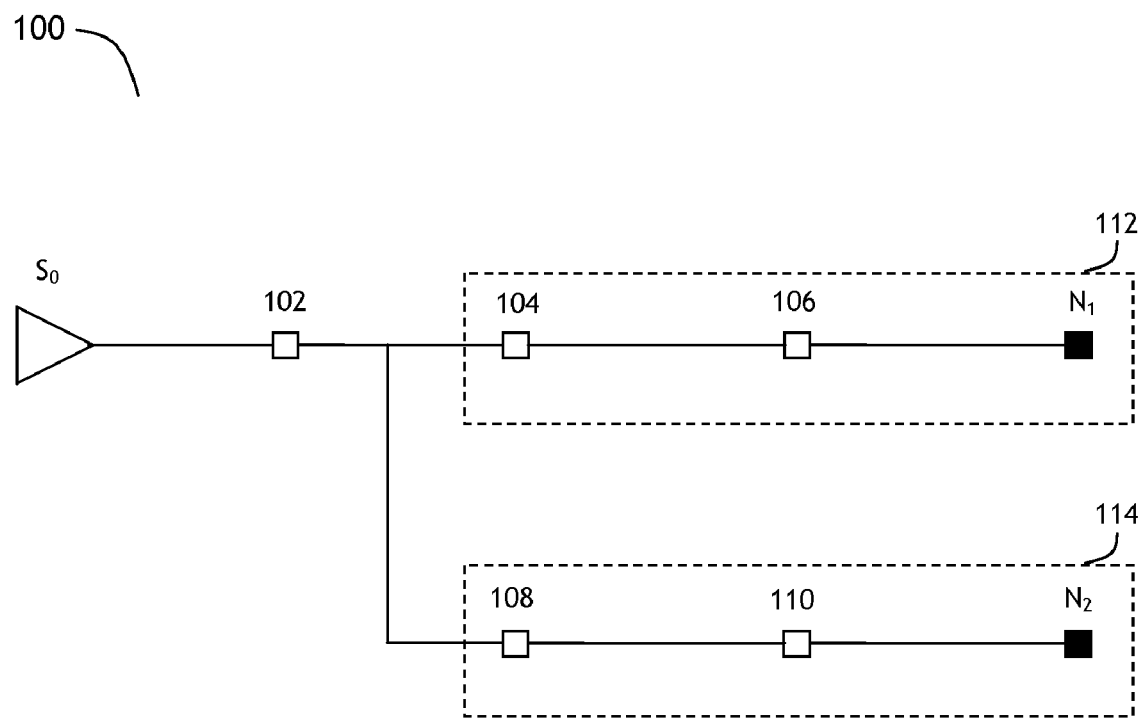
FIG. 1 is an exemplary tree structure of a net for an IC design.

Referring to FIG. 1, there is shown an exemplary tree structure of a net 100 for an IC design including a source $S_0$, a plurality of non-leaf nodes 102 through 110, a first leaf node $N_1$ and second leaf node $N_2$. The source $S_0$ and all nodes are interconnected via wire segments. The net 100 comprises two sub-trees in this exemplary tree structure: a first sub-tree 112 including node 104, node 106 and the first leaf node $N_1$; and a second sub-tree 114 including node 108, node 110 and the second leaf node $N_2$.

The parallel buffer insertion method may process the net 100 in a bottom-up manner. For example, the method may process from the leaf nodes towards the source. Referring to FIGS. 2 and 3, there are shown a plurality of buffering options for the sub-tree 112. Node $N_1$ is connected to node 106 via a wire segment, forming a sub-tree 202 within the sub-tree 112. A buffer may be placed at node 106. For instance, if two different types of buffers may be utilized, we may have three buffering options for the sub-tree 202, as illustrated in FIGS. 2(a), (b) and (c). In this example, no buffer is placed at node 106 in FIG. 2(a), a first buffer type is placed at node 106 in FIG. 2(b), and a second buffer type different from the first buffer type is placed at node 106 in FIG. 2(c).

Based on the required arrival time and downstream capacitance of node $N_1$, and the required arrival time and downstream capacitance of node 106 (including the buffer if present), the required arrival time and downstream capacitance of the sub-tree 202 may be determined. The determined required arrival time and downstream capacitance (may be referred to as RC influence), as denoted in (q, c) pairs, are indicated for each of the three buffering options for the sub-tree 202 (the numerical values in the figure are exemplary).

The buffer insertion process may work towards the source by adding a wire segment that connects the sub-tree 202 with node 104. Adding the wire segment to the sub-tree 202 may alter the RC influences according to the following formulas:

$$q_{new} = q - \frac{r(l) \cdot c(l)}{2} - r(l) \cdot c$$

$$c_{new} = c + c(l)$$

where r(l) is the distributed resistance of the wire segment of length l; and c(l) is the distributed capacitance of the wire segment of length l.

The ($q_{new}, c_{new}$) values for different buffering options may be computed in parallel according to the above formulas. For example, the sub-tree 202 in this example includes three buffering options; therefore, two or more ($q_{new}, c_{new}$) values may be calculated in parallel. The exemplary ($q_{new}, c_{new}$) values computed for the buffering options are illustrated in FIG. 3, which now includes the added wire segment.

Once the addition of the wire segment is processed, the method may proceed towards the source by including node 104. A buffer may be inserted/added at node 104. Adding a buffer at node 104 may alter the RC influences according to the following formulas:

$$q_{new} = q - R_{buffer} \cdot c - t_{buffer}$$

$$c_{new} = c_{buffer}$$

where $R_{buffer}$, $c_{buffer}$ and $t_{buffer}$ are the resistance, capacitance, and time delay of the buffer being added.

Figure 4:
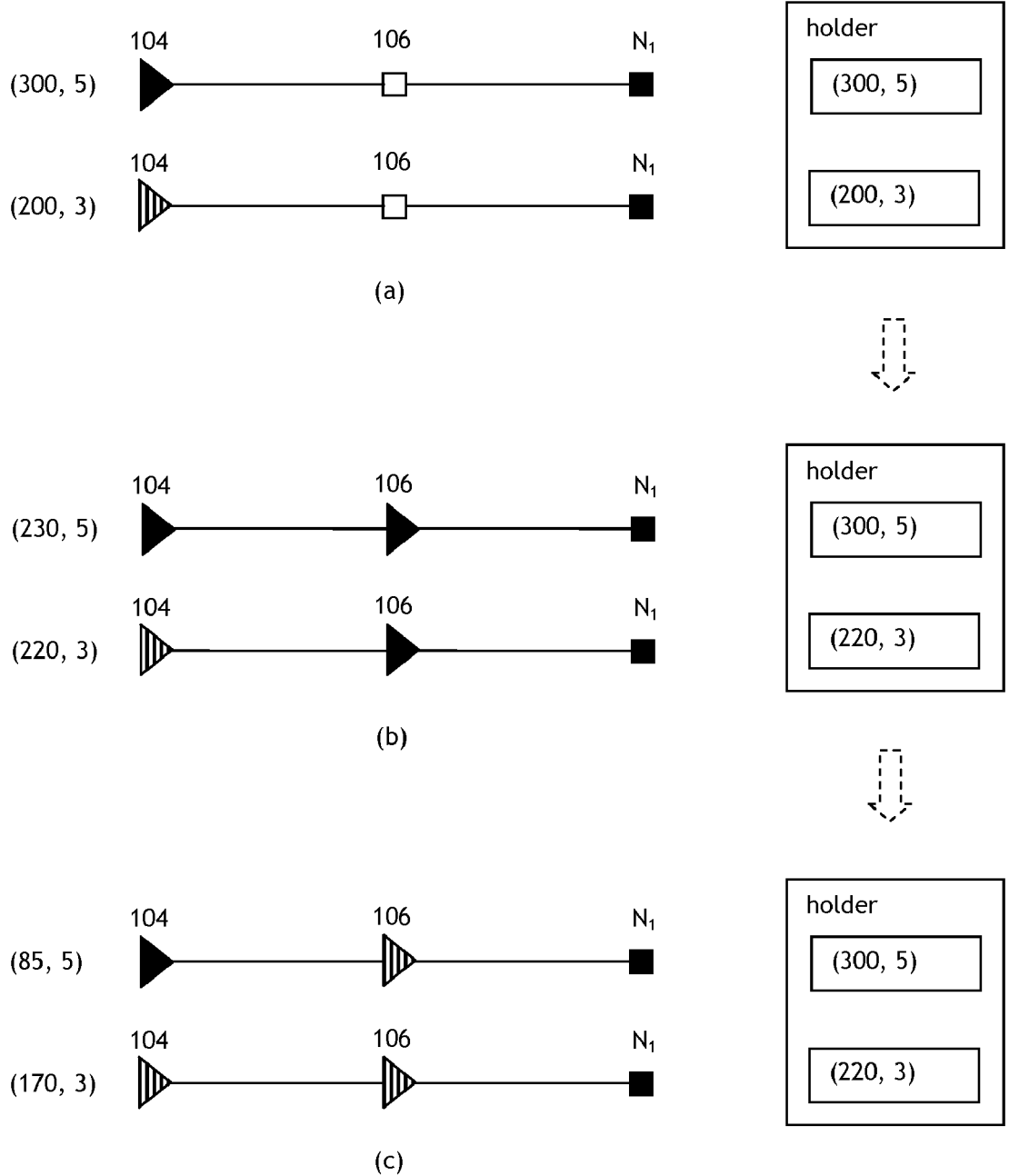
FIG. 4 is another illustration of a plurality of buffering options for a sub-tree of the exemplary tree of FIG. 1.
Figure 5:
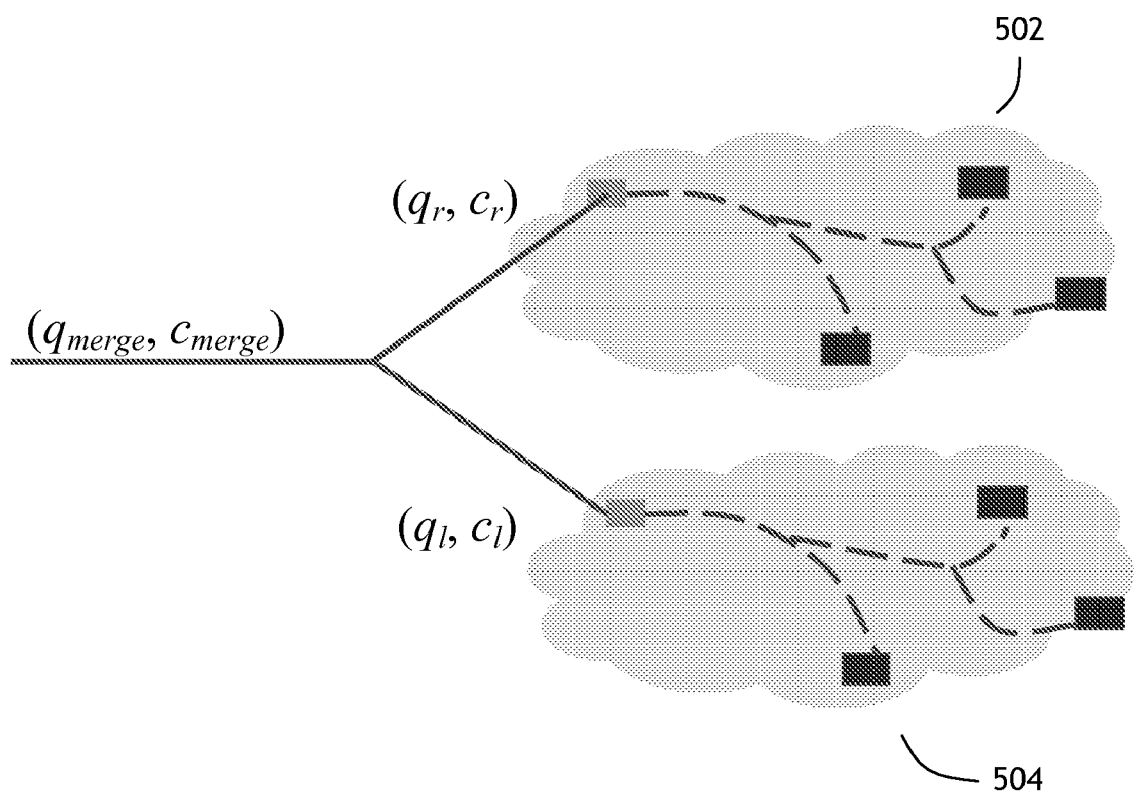
FIG. 5 is an illustration of merging of two sub-trees for an IC design.

For example, if the buffer to be added may be one of two types, then each buffering option presented in FIG. 3 may require two independent calculations of the new RC influences (i.e., each buffer type requires a calculation based on the above formula). This process may be illustrated in FIG. 4. In one embodiment, the process may calculate the new RC influences for adding different types of buffers to a given buffering option of FIG. 3 in parallel. For example, adding both types of buffers to the buffering option of FIG. 3(a) may be calculated in parallel, producing two buffering options as illustrated in FIG. 4(a). A buffer RC influence holder may be utilized to store the calculated RC influence values corresponding to the addition of the first and second type of buffers.

Subsequently, adding both types of buffers to the buffering option of FIG. 3(b) may be calculated in parallel, producing two buffering options as illustrated in FIG. 4(b). The calculated RC influence values corresponding to the addition of the first and second type of buffers to the buffering option of FIG. 3(b) may then be compared to the values stored in the buffer RC influence holder for necessary updates. For instance, as illustrated in FIG. 4(b), adding the first buffer type to the buffering option of FIG. 3(b) may produce a new RC influence which has a smaller q value than the q value stored in the holder with respect to the first buffer type (i.e., 230<300). Therefore, the option of adding the first buffer type to the buffering option of FIG. 3(b) may be discarded. In another example, adding the second buffer type to the buffering option of FIG. 3(b) may produce a new RC influence which has a greater q value than the q value stored in the holder with respect to the second buffer type (i.e., 220>200). Therefore, the option of adding the second buffer type to the buffering option of FIG. 3(b) may be kept for further processing, and the new RC influence produced may be stored in to the holder (updates the existing value).

Subsequently, adding both types of buffers to the buffering option of FIG. 3(c) may be calculated in parallel, producing two buffering options as illustrated in FIG. 4(c). The calculated RC influence values corresponding to the addition of the first and second type of buffers to the buffering option of FIG. 3(c) may then be compared to the values stored in the buffer RC influence holder for necessary updates. For instance, as illustrated in FIG. 4(c), adding the first buffer type to the buffering option of FIG. 3(c) may produce a new RC influence which has a smaller q value than the q value stored in the holder with respect to the first buffer type (i.e., 85<300). Therefore, the option of adding the first buffer type to the buffering option of FIG. 3(c) may be discarded. In another example, adding the second buffer type to the buffering option of FIG. 3(c) may produce a new RC influence which has a smaller q value than the q value stored in the holder with respect to the second buffer type (i.e., 170<220). Therefore, the option of adding the second buffer type to the buffering option of FIG. 3(c) may also be discarded.

At this point, all buffering options of FIG. 3 have been processed. Based on the values in the buffer RC influence holder, it may be determined that adding the first buffer type to the buffering option of FIG. 3(a) (having RC influence of (300,5)) and adding the second buffer type to the buffering option of FIG. 3(b) (having RC influence of (220, 3)) are the optimal candidates for the sub-tree 112.

It is understood that the second sub-tree 114 (FIG. 1) may be processed similar to the first sub-tree 112 as previously described. It is also understood that a tree structure may comprise more complex sub-trees than the exemplary structure as shown, without departing from the scope and spirit of the present disclosure.

Referring now to FIGS. 5 through 8, a process for merging two sub-trees is shown. The RC influence of the merged tree may be calculated based on the RC influences of each sub-tree being merged based on the following formulas:

$$q_{merge} = \min(q_l, q_r)$$

$$c_{merge} = c_l + c_r$$

where $q_r$ and $c_r$ are the required arrival time and downstream capacitance of a particular buffering option for sub-tree 502; and $q_l$ and $c_l$ are the required arrival time and downstream capacitance of a particular buffering option for sub-tree 504.

Sub-tree 502 may comprise one or more buffering options and sub-tree 504 may also comprise one or more buffering options. Therefore, each buffering option for sub-tree 502 may be merged with one of the buffering options for sub-tree 504. It is understood, however, that some of the merges may not be necessary (redundant merges), and techniques such as pruning may be utilized for reducing redundancies.

Sub-tree 502 may be merged with sub-tree 504 by first grouping the plurality of buffering options available for sub-tree 502 and the plurality of buffering options available for sub-tree 504 into one or more merging groups, and then merging two or more groups of the plurality of merging groups in parallel. It is contemplated that pruning techniques may be utilized during the grouping process.

For example, given a first sub-tree (referred to as left tree for simplicity) having two buffering options, and a second sub-tree (referred to as right tree for simplicity) having three buffering options. The RC influences of the buffering options for both left and right trees may be expressed in terms of (q,c) values in a sorted order within each tree (e.g., ascending order from top-to-bottom):

| Left tree | Right tree |
|---|---|
| $(q_{l1}, c_{l1})$ | $(q_{r1}, c_{r1})$ |
| $(q_{l2}, c_{l2})$ | $(q_{r2}, c_{r2})$ |
| | $(q_{r3}, c_{r3})$ |

Further assuming in this example that $q_{r1} < q_{r2} < q_{l1} < q_{r3} < q_{l2}$, $c_{l1} < c_{l2}$ and $c_{r1} < c_{r2} < c_{r3}$.

Figure 6:
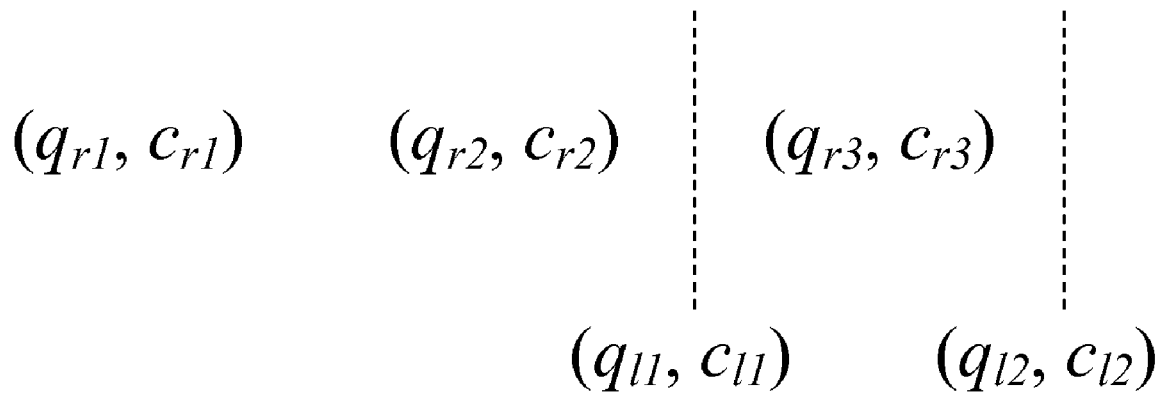
FIG. 6 is an illustration of ordering of RC influences for buffering options for two sub-trees.

During parallel merging, the buffering options for the left tree and the buffering options for the right tree may be grouped into one or more merging groups first. In one embodiment, the grouping process may first determine the order of the buffering options for the left tree with respect to the buffering options for the right tree. The order may be determined based on the required arrival times (i.e., values of q) for the buffering options. Based on the buffering options given in the above table, the ordering of the buffering options for the left tree with respect to the buffering options for the right tree is illustrated in FIG. 6. It is contemplated that a sorting algorithm (e.g., binary search, quick sort, and other sorting algorithms) may be utilized to facilitate the ordering process.

Figure 7:
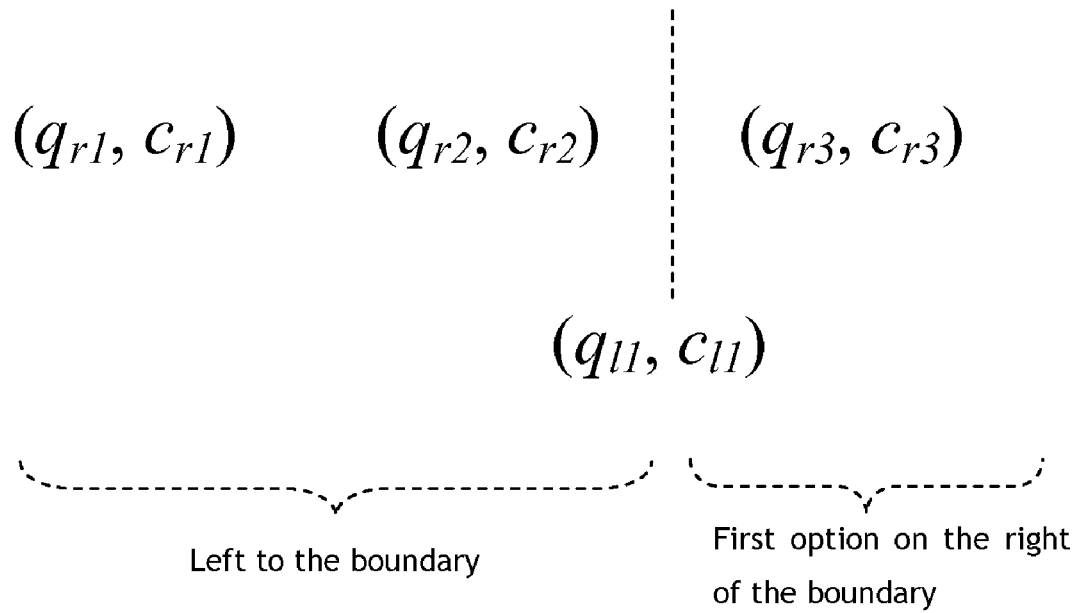
FIG. 7 is an illustration of a grouping process based on the ordering of FIG. 6.
Figure 8:
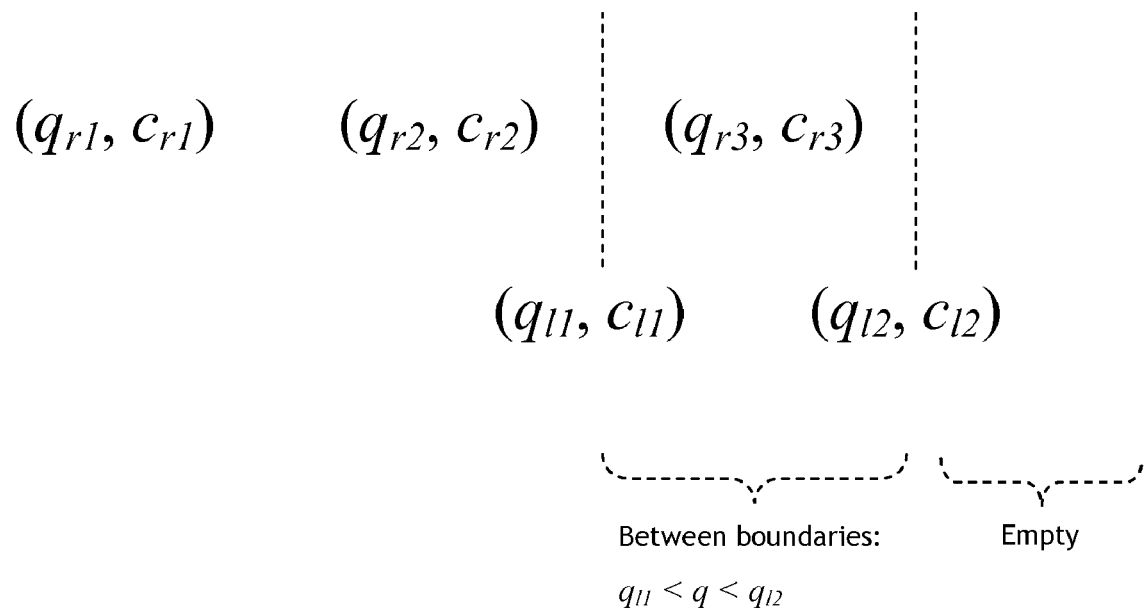
FIG. 8 is another illustration of a grouping process based on the ordering of FIG. 6.

FIGS. 7 and 8 illustrate the grouping process based on the ordering obtained above. In one embodiment, the rules for grouping may be defined as follows:

for the first buffering option for the left tree $((q_{l1}, c_{l1})$ in this example):
create a merge group (G1 in this example) for merging $(q_{l1}, c_{l1})$ with each buffering option for the right tree that has a q value smaller than $(q_{l1}, c_{l1})$ (i.e., $(q_{r1}, c_{r1})$ and $(q_{r2}, c_{r2})$ in this example); and
create a merge group (G2 in this example) for merging $(q_{l1}, c_{l1})$ with the buffering option for the right tree that is immediately to the right of $(q_{l1}, c_{l1})$ in the ordering (i.e., $(q_{r3}, c_{r3})$ in this example; additional buffering options to the right, if any, may be discarded as a pruning technique); and for the $i^{th}$ buffering option for the left tree (the second option $(q_{l2}, c_{l2})$ in this example):
create a merge group (G3 in this example) for merging $(q_{li}, c_{li})$ with each buffering option for the right tree that has a q value smaller than $(q_{li}, c_{li})$, but greater than $(q_{l(i-1)}, c_{l(i-1)})$ (i.e., between the positions of $(q_{l1}, c_{l1})$ and $(q_{l2}, c_{l2})$ in this example); and
create a merge group (G4 in this example) for merging $(q_{li}, c_{li})$ with the buffering option for the right tree that is immediately to the right of $(q_{li}, c_{li})$ in the ordering (no such option in this example).

Three merging groups (G4 is empty and thus discarded) may be created for the above example. The parallel merging process may then merge two or more of the merging groups in parallel.

It is understood that merging of more than two sub-trees may be processed by merging two sub-trees first, and then merging the merged tree with each remaining sub-tree. Therefore, the merging process may be utilized for processing a net having a structure other than a binary tree.

It is contemplated that a given tree structure may be divided in to a plurality of sub-trees, wherein more than one sub-tree may be processed in a parallel manner. It is also contemplated that a processing time for each sub-tree may be estimated, which may be utilized for load balancing and/or other scheduling purposes. The processing time for a sub-tree may be estimated, for example, based on the number of insertion points and/or criticality of the branches.

FIG. 9 shows a flow diagram illustrating steps performed by a method 900 in accordance with the present disclosure. The method 900 may be utilized for determining a plurality of buffer insertion locations in a net for an integrated circuit design.

Step 902 may calculate in parallel a plurality of resistive-capacitive (RC) influences by adding a wire segment. Each RC influence may correspond to the addition of a wire segment to each of the buffering options available for a first sub-tree. In one embodiment, step 904 may calculate a first RC influence for adding the wire segment to the first sub-tree in a first buffering option, and step 906 may calculate a second RC influence in parallel with the first RC influence for adding the wire segment to the first sub-tree in a second buffering option different from the first buffering option.

Step 908 may update the plurality of RC influences for the addition of a buffer for the first sub-tree. The buffer to be added may be one of a plurality of buffer types. In one embodiment, step 910 may calculate in parallel a first set of buffer RC influences for the first sub-tree as configured in the first buffering option. Each of the first set of buffer RC influences may correspond to one of the plurality of buffer types. Step 912 may store the first set of buffer RC influences to a buffer RC influence holder (e.g., a memory location). Step 914 may calculate in parallel a second set of buffer RC influences for the first sub-tree as configured in the second buffering option. Each of the second set of buffer RC influences may correspond to one of the plurality of buffer types. Step 916 may update the buffer RC influence holder if a required arrival time in the second set of buffer RC influences is greater than a corresponding required arrival time stored in the buffer RC influence holder.

Step 918 may merge the first sub-tree with a second sub-tree in parallel by grouping the plurality of buffering options available for the first sub-tree and a plurality of buffering options available for the second sub-tree into a plurality of merging groups (previously described). At least two groups of the plurality of merging groups may then be merged in parallel.

Figure 10:
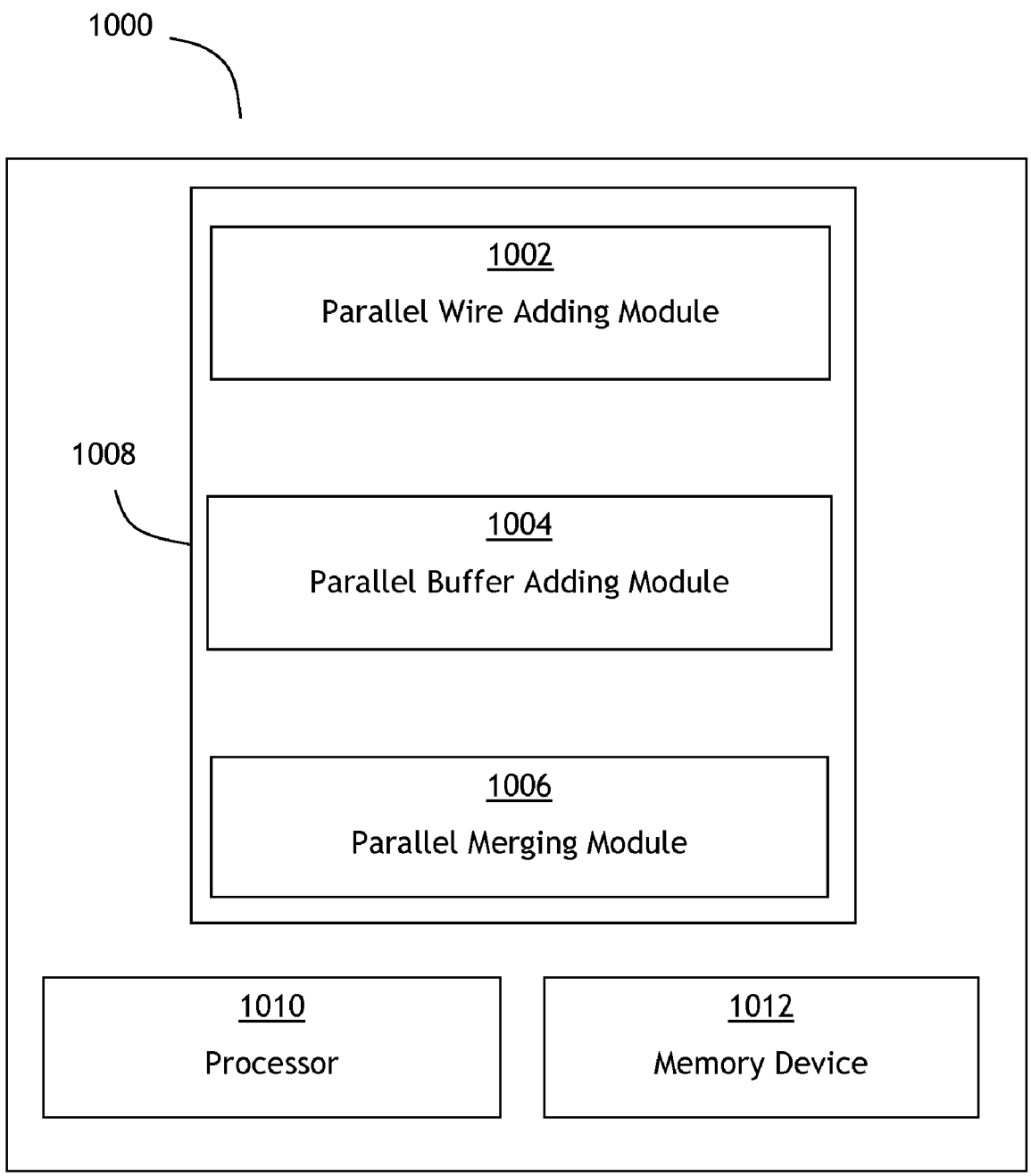
FIG. 10 is a block diagram illustrating a computer system for determining a plurality of buffer insertion locations in a net for an integrated circuit design.

Referring to FIG. 10, a block diagram illustrating a computer system 1000 for determining a plurality of buffer insertion locations in a net for an integrated circuit design is shown. The computer system 1000 may comprise one or more processors 1010 and one or more memory devices 1012 accessible to the processors. The processors 1010 may be configured for processing/executing a plurality of program instructions 1008. The program instructions 1008 may be stored on the memory devices 1012 or other data/instruction storage devices.

In one embodiment, the program instructions 1008 may comprise a parallel wire adding module 1002 configured for calculating RC influences for addition of wire segments. A parallel buffer adding module 1004 may be configured for calculating RC influences for addition of buffers. A parallel merging module 1006 may be configured for merging two sub-trees in parallel.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method for determining a plurality of buffer insertion locations in a net for an integrated circuit design, comprising:
    calculating a plurality of resistive-capacitive (RC) influences in parallel, each RC influence corresponding to one of a plurality of buffering options available for a first sub-tree for an addition of a wire segment to the first sub-tree, comprising:
        calculating a first RC influence for adding the wire segment to the first sub-tree in a first buffering option; and
        calculating a second RC influence in parallel with the first RC influence for adding the wire segment to the first sub-tree in a second buffering option different from the first buffering option;
    updating the plurality of RC influences for the addition of a buffer for the first sub-tree, the buffer comprising one of a plurality of buffer types, comprising:
        calculating in parallel a first set of buffer RC influences for the first sub-tree as configured in the first buffering option, each of the first set of buffer RC influences corresponding to one of the plurality of buffer types;
        storing the first set of buffer RC influences to a buffer RC influence holder;
        calculating in parallel a second set of buffer RC influences for the first sub-tree as configured in the second buffering option, each of the second set of buffer RC influences corresponding to one of the plurality of buffer types; and
        updating the buffer RC influence holder when a required arrival time in the second set of buffer RC influences is greater than a corresponding required arrival time stored in the buffer RC influence holder; and
    using a computer or processor to merge the first sub-tree with a second sub-tree in parallel by grouping the plurality of buffering options available for the first sub-tree and a plurality of buffering options available for the second sub-tree into a plurality of merging groups, and merging at least two groups of the plurality of merging groups in parallel.

2. The method as claimed in claim 1, wherein calculating a plurality of resistive-capacitive (RC) influences in parallel further comprising:
    calculating another RC influence in parallel with the first RC influence for adding the wire segment to the first sub-tree in another buffering option different from the first and second buffering options.

3. The method as claimed in claim 1, wherein the buffer RC influence holder comprising a computer accessible memory.

4. The method as claimed in claim 1, wherein grouping the plurality of buffering options available for the first sub-tree and the plurality of buffering options available for the second sub-tree into the plurality of merging groups comprises:
    determining an order of the plurality of buffering options available for the first sub-tree with respect to the plurality of buffering options available for the second sub-tree; and
    selectively grouping each buffering options of the plurality of buffering options available for the first sub-tree with the plurality of buffering options available for the second sub-tree based on the order determined.

5. The method as claimed in claim 4, wherein a binary search algorithm is utilized for determining the order.

6. A computer-readable device having computer-executable instructions for performing a method for determining a plurality of buffer insertion locations in a net for an integrated circuit design, said method comprising:
    calculating a plurality of resistive-capacitive (RC) influences in parallel, each RC influence corresponding to one of a plurality of buffering options available for a first sub-tree for an addition of a wire segment to the first sub-tree, comprising:
        calculating a first RC influence for adding the wire segment to the first sub-tree in a first buffering option; and
        calculating a second RC influence in parallel with the first RC influence for adding the wire segment to the first sub-tree in a second buffering option different from the first buffering option;
    updating the plurality of RC influences for the addition of a buffer for the first sub-tree, the buffer comprising one of a plurality of buffer types, comprising:

calculating in parallel a first set of buffer RC influences for the first sub-tree as configured in the first buffering option, each of the first set of buffer RC influences corresponding to one of the plurality of buffer types;

storing the first set of buffer RC influences to a buffer RC influence holder;

calculating in parallel a second set of buffer RC influences for the first sub-tree as configured in the second buffering option, each of the second set of buffer RC influences corresponding to one of the plurality of buffer types; and updating the buffer RC influence holder when a required arrival time in the second set of buffer RC influences is greater than a corresponding required arrival time stored in the buffer RC influence holder; and merging the first sub-tree with a second sub-tree in parallel by grouping the plurality of buffering options available for the first sub-tree and a plurality of buffering options available for the second sub-tree into a plurality of merging groups, and merging at least two groups of the plurality of merging groups in parallel.

7. The computer-readable device having computer-executable instructions for performing a method as claimed in claim 6, wherein calculating a plurality of resistive-capacitive (RC) influences in parallel further comprising:

calculating another RC influence in parallel with the first RC influence for adding the wire segment to the first sub-tree in another buffering option different from the first and second buffering options.

8. The computer-readable device having computer-executable instructions for performing a method as claimed in claim 6, wherein the buffer RC influence holder comprising a computer accessible memory.

9. The computer-readable device having computer-executable instructions for performing a method as claimed in claim 6, wherein grouping the plurality of buffering options available for the first sub-tree and the plurality of buffering options available for the second sub-tree into the plurality of merging groups comprises:

determining an order of the plurality of buffering options available for the first sub-tree with respect to the plurality of buffering options available for the second sub-tree; and selectively grouping each buffering options of the plurality of buffering options available for the first sub-tree with the plurality of buffering options available for the second sub-tree based on the order determined.

10. The computer-readable device having computer-executable instructions for performing a method as claimed in claim 9, wherein a binary search algorithm is utilized for determining the order.

11. A computer system, comprising:

at least one processor for processing a plurality of program instructions;

a memory device accessible to the at least one processor;

the plurality of program instructions for determining a plurality of buffer insertion locations in a net for an integrated circuit design, comprising:

calculating a plurality of resistive-capacitive (RC) influences in parallel, each RC influence corresponding to one of a plurality of buffering options available for a first sub-tree for an addition of a wire segment to the first sub-tree, comprising:

calculating a first RC influence for adding the wire segment to the first sub-tree in a first buffering option; and calculating a second RC influence in parallel with the first RC influence for adding the wire segment to the first sub-tree in a second buffering option different from the first buffering option;

updating the plurality of RC influences for the addition of a buffer for the first sub-tree, the buffer comprising one of a plurality of buffer types, comprising:

calculating in parallel a first set of buffer RC influences for the first sub-tree as configured in the first buffering option, each of the first set of buffer RC influences corresponding to one of the plurality of buffer types;

storing the first set of buffer RC influences to a buffer RC influence holder;

calculating in parallel a second set of buffer RC influences for the first sub-tree as configured in the second buffering option, each of the second set of buffer RC influences corresponding to one of the plurality of buffer types; and updating the buffer RC influence holder when a required arrival time in the second set of buffer RC influences is greater than a corresponding required arrival time stored in the buffer RC influence holder; and merging the first sub-tree with a second sub-tree in parallel by grouping the plurality of buffering options available for the first sub-tree and a plurality of buffering options available for the second sub-tree into a plurality of merging groups, and merging at least two groups of the plurality of merging groups in parallel.

12. The computer system as claimed in claim 11, wherein calculating a plurality of resistive-capacitive (RC) influences in parallel further comprising:

calculating another RC influence in parallel with the first RC influence for adding the wire segment to the first sub-tree in another buffering option different from the first and second buffering options.

13. The computer system as claimed in claim 11, wherein the buffer RC influence holder resides in the memory device.

14. The computer system as claimed in claim 11, wherein grouping the plurality of buffering options available for the first sub-tree and the plurality of buffering options available for the second sub-tree into the plurality of merging groups comprises:

determining an order of the plurality of buffering options available for the first sub-tree with respect to the plurality of buffering options available for the second sub-tree; and selectively grouping each buffering options of the plurality of buffering options available for the first sub-tree with the plurality of buffering options available for the second sub-tree based on the order determined.

15. The computer system as claimed in claim 14, wherein a binary search algorithm is utilized for determining the order.

* * * * *